United States Patent [19]
Sato et al.

[11] Patent Number: 6,083,770
[45] Date of Patent: Jul. 4, 2000

[54] THERMOELECTRIC PIECE AND PROCESS OF MAKING THE SAME

[75] Inventors: Takehiko Sato, Mino; Kazuo Kamada, Hirakata, both of Japan

[73] Assignee: Matsushita Electric Works, Ltd., Osaka, Japan

[21] Appl. No.: 09/068,456
[22] PCT Filed: Dec. 22, 1997
[86] PCT No.: PCT/JP97/04757
§ 371 Date: Nov. 10, 1998
§ 102(e) Date: Nov. 10, 1998
[87] PCT Pub. No.: WO98/28801
PCT Pub. Date: Jul. 2, 1998

[30] Foreign Application Priority Data

Dec. 24, 1996 [JP] Japan .................................. 8-342878

[51] Int. Cl.[7] .................. H01L 21/00; H01L 31/058; G01N 25/00
[52] U.S. Cl. ....................... 438/54; 257/467; 324/451
[58] Field of Search ...................... 438/54, 55; 136/201, 136/237; 252/62.3 T; 257/930, 467; 324/451; 361/162

[56] References Cited

U.S. PATENT DOCUMENTS

| | | |
|---|---|---|
| 3,045,057 | 7/1962 | Cornish et al. . |
| 3,444,005 | 5/1969 | Avis et al. . |
| 3,808,670 | 5/1974 | Seetoo ................................... 228/123.1 |
| 3,859,143 | 1/1975 | Krebs . |
| 3,930,303 | 1/1976 | Alais .......................................... 29/573 |
| 3,988,171 | 10/1976 | Miller ...................................... 136/237 |
| 4,180,415 | 12/1979 | Hampl, Jr. . |
| 4,489,742 | 12/1984 | Moore ...................................... 136/203 |
| 4,650,919 | 3/1987 | Benson .................................... 136/212 |
| 5,241,828 | 9/1993 | Kapitulnik . |
| 5,429,680 | 7/1995 | Fuschetti . |
| 5,817,188 | 9/1996 | Yahatz ...................................... 136/237 |

FOREIGN PATENT DOCUMENTS 952678 3/1964 United Kingdom .

*Primary Examiner*—Charles Bowers
*Assistant Examiner*—Nema Berezny
*Attorney, Agent, or Firm*—Arent Fox Plotkin Kintner Kahn

[57] ABSTRACT

A thermoelectric piece has an increased adhesive strength between a semiconductor matrix of Bi—Sb—Te or Bi—Te—Se and a diffusion barrier layer deposited thereon for blocking diffusion of a soldering material into the semiconductor matrix. An Sn-alloy layer is provided between the semiconductor matrix and the diffusion barrier layer of Mo, W, Nb and Ni to give the enhanced adhesive strength. The Sn-alloy is formed at the interface with the semiconductor matrix by interdiffusion of Sn with at least one element of the semiconductor. It is found that Sn will not lower the thermoelectric characteristics when diffusing into the semiconductor matrix and provides an sufficient adhesive strength to the metal elements of the diffusion barrier layer. The thermoelectric piece is made through the steps of:
a) preparing the thermoelectric semiconductor having opposed faces;
b) depositing a tin layer on each of the opposed faces of the thermoelectric semiconductor;
c) diffusing Sn mutually with at least one element of the thermoelectric semiconductor to form the Sn-alloy layer on the each of the opposed faces;
d) depositing a diffusion barrier layer of Mo, W, Nb, or Ni on each of the Sn-alloy layer.

9 Claims, 3 Drawing Sheets

FIG. 7D Sb DISTRIBUTION

FIG. 7C Te DISTRIBUTION

FIG. 7B Sn DISTRIBUTION

Mo
Sn-alloy
SEMICONDUCTOR MATRIX

FIG. 8D Bi DISTRIBUTION

FIG. 8C Te DISTRIBUTION

FIG. 8B Sn DISTRIBUTION

Mo
Sn-alloy
SEMICONDUCTOR MATRIX

THERMOELECTRIC PIECE AND PROCESS OF MAKING THE SAME

TECHNICAL FIELD

The present invention is directed to thermoelectric pieces of P-type and N-type thermoelectric semiconductors which are ready for immediate connection with electrodes to provide a module or circuit of a thermoelectric heater/cooler or thermoelectric generators and more particularly to such thermoelectric pieces with increased adhesive strength with the electrodes.

BACKGROUND ART

Japanese Patent Laid-open publication No. 4-249385 proposed a prior art thermoelectric piece which comprises a thermoelectric semiconductor coated on its opposed faces respectively with Ni-layers for soldering connection with corresponding electrodes. The Ni-layer is selected to block interdiffusion of one or more elements of the thermoelectric semiconductor and a soldering material into each other in order to avoid lowering of thermoelectric characteristics over a long time of use. However, the Ni layer is found to give only a reduced adhesive strength to the thermoelectric semiconductor, which may result in disconnection of the circuit and lower reliability of the thermoelectric device.

DISCLOSURE OF THE INVENTION

The above problem has been overcome by the present invention which provides a thermoelectric piece capable of giving an increased adhesive strength between a diffusion barrier layer and a semiconductor matrix, yet effectively blocking the diffusion of one or more elements of the thermoelectric semiconductor to maintain reliable thermoelectric characteristics over a long time of use.

The thermoelectric piece in accordance with the present invention comprises a thermoelectric semiconductor of Bi—Sb—Te or Bi—Te—Se having opposed faces, an Sn-alloy layer disposed on each of the opposed faces of the semiconductor, and a diffusion barrier layer disposed on each the Sn-alloy layer. The diffusion barrier layer is made of at least one element selected from the group consisting of Mo, W, Nb and Ni for blocking diffusion of the elements of the thermoelectric semiconductor and/or a soldering material utilized for electrical connection of said thermoelectric semiconductor to an external electric circuit. The Sn-alloy layer comprises Sn as an essential metal element which diffuses mutually with at least one element of the semiconductor to form at least one Sn-alloy selected from a group consisting of Sn—Bi alloy, Sn—Te alloy, Sn—Sb alloy, Sn—Se alloy, Sn—Bi—Te alloy, Sn—Bi—Sb alloy, Sn—Bi—Se alloy, Sn—Te—Se alloy, and Sn—Te—Sb alloy, in the form of either a solid solution, an intermetallic or combination of these. With the provision of the Sn-alloy layer between the thermoelectric semiconductor and the diffusion barrier layer, the diffusion barrier layer can have an increased adhesive strength to the semiconductor because of a diffusion bonding at the interface with the semiconductor matrix due-to the interdiffusion, and also because of an alloy bonding between the Sn-alloy layer and the diffusion barrier layer of the selected element. It is found that Sn will not lower the thermoelectric characteristic when diffusing into the semiconductor matrix and provides an sufficient adhesive strength to the metal elements of the diffusion barrier layer.

The alloy layer may be formed therein with a tin lamina replete with Sn contained in 90% or more based upon the atomic weight ratio. The tin lamina can give a good platform for enhanced bonding with the diffusion barrier layer of Mo, W, Nb, and Ni.

The Sn-alloy layer, which is defined to have 10% of more of Sn based upon the atomic weight ratio, is preferably made to have a thickness of 0.1 to 3.0 μm. The tin lamina is preferred to have a thickness less than 2.0 μm, while the diffusion barrier layer has a thickness of 0.1 to 5.0 μm.

The present invention also discloses a process of making the thermoelectric piece which comprises the steps of:
a) preparing a thermoelectric semiconductor of Bi—Sb—Te or Bi—Te—Se having opposed faces;
b) depositing a tin layer of Sn on each of said opposed faces of the thermoelectric semiconductor;
c) diffusing the Sn mutually with at least one element of the thermoelectric semiconductor to form an Sn-alloy layer on the each of the opposed faces of the thermoelectric semiconductor;
d) depositing a diffusion barrier layer on each of said Sn-alloy layer, the diffusion barrier layer being made of at least one element selected from the group consisting of Mo, W, Nb, and Ni.

With this process, the Sn-alloy layer can be readily formed on the thermoelectric semiconductor for ensuring increased bonding between the thermoelectric semiconductor and the diffusion barrier layer.

When the diffusion barrier layer is made of Mo, W, or Nb, an additional diffusion barrier layer of Ni may be formed on each of the diffusion barrier layer of Mo, W, or Nb, and a terminal layer is subsequently formed on the additional diffusion barrier layer of Ni. The terminal layer is made of an element selected from the group consisting of Cu, Au, Bi—Sn, and Sn for soldering connection with an electrode. The additional diffusion barrier layer of Ni can ensure further blocking of the diffusion of the soldering material, while the terminal layer can enhance wettability to the soldering material and therefore ensure successful soldering electrical connection of the thermoelectric semiconductor to the electrode.

The tin layer arid the diffusion barrier layer as well as the additional diffusion barrier layer are preferably formed by a sputtering or other vapor disposition technique.

The tin layer, after being deposited on the semiconductor, may be heated at 120° C. to 300° C. for 1 minute to 60 minutes so as to promote forming of the Sn-alloy layer and to enhance the alloy bonding between the resulting Sn-alloy layer and the diffusion barrier layer. The heating may be made alternately after depositing the diffusion barrier layer or the additional diffusion barrier layer, in which case there is expected an increased adhesive strength between the Sn-alloy layer and the diffusion barrier layer and between the diffusion barrier layer and the additional diffusion barrier layer.

Prior to being depositing with the tin layer, the thermoelectric semiconductor is preferably processed through a pre-deposition treatment. The pre-deposition treatment comprises the steps of mechanically grinding the opposed faces in a wet environment; ultrasonically cleaning said opposed faces; and making plasma etching the opposed faces to give a minutely roughed surface. This pre-deposition treatment can facilitate the subsequent deposition of the layers and improve the adhesive strength of the diffusion barrier layer to the thermoelectric semiconductor.

The tin layer, the diffusion barrier layer, the additional diffusion barrier layer, and the terminal layer are deposited continuously in a vacuum environment for avoiding otherwise possible oxidization of the intermediate layers to thereby assure improve the adhesive strength.

These and still other objects and advantageous features of the present invention will become apparent from the following description of the preferred embodiments taken in conjunction with the attached drawings.

BRIEF DESCRIPTION OF THE DRAWINGS

FIGS. 7B to 7D are digitally processed images respectively illustrating Sn distribution, Te distribution, and Sb distribution of the P-type thermoelectric piece of the embodiment of FIG. 1;

FIGS. 8B to 8D are digitally processed images respectively illustrating Sn distribution, Te distribution, and Sb distribution of the N-type thermoelectric pieces of the embodiment of FIG. 1.

MODES FOR CARRYING OUT THE INVENTION

A thermoelectric piece of the present invention is utilized for assembling a thermoelectric device, such as a heater/cooler and a thermoelectric generator. Two thermoelectric pieces are employed in the device and include thermoelectric semiconductors of P-type and N-type which are electrically connected in series by way of suitable electrodes to form a series circuit for passing therethrough an electric current. The P-type thermoelectric semiconductor is made of a polycrystalline material Bi—Te—Sb, while the N-type semiconductor is made of polycrystalline material Bi—Te—Se.

Figure 1:
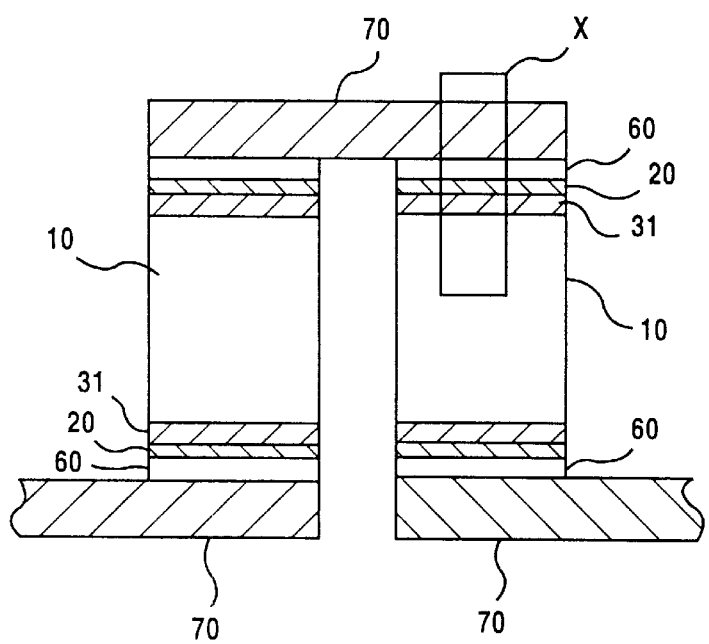
FIG. 1 is a partly sectional view of thermoelectric pieces connected to associated electrodes in accordance with a preferred embodiment of the present invention.

As shown in FIG. 1, each of the thermoelectric semiconductor 10 is formed to have opposed faces which are connected respectively to the electrodes 70, typically by use of a soldering material 60, such as Sn—Pb. Formed on each of the opposed faces of the semiconductor is a diffusion barrier layer 20 in order to block interdiffusion of the elements of the semiconductor 10 into the soldering material 60 and of the soldering material into the semiconductor 10 in order to avoid lowering of the thermoelectric characteristics as well as lowering the bonding capability of the soldering material. For this purpose, the diffusion barrier layer 20 is made of a material selected from the group consisting of Mo, W, Nb, and Ni.

In view of the fact that the diffusion barrier layer 20 alone shows an extremely low adhesive strength to the semiconductor 10, there is provided an Sn-alloy layer 31 between the diffusion barrier layer 20 and the semiconductor 10 in order to give an increased adhesive strength sufficient to keep the semiconductor 10 connected to the electrode 70 over a long time of use during which a number of heat cycles and other mechanical stress would be applied to the interface. The Sn-alloy layer 31 is formed by depositing a tin layer 30 on the semiconductor 10 and by allowing to diffuse the elements of the semiconductor 10 into the tin layer and simultaneously diffuse Sn of the tin layer into the semiconductor matrix. In this sense, the Sn-alloy layer 31 can be termed as a diffusion layer in contrast to the above diffusion barrier layer 20. With this interdiffusion, the Sn-alloy layer 31 can merge into the surface area of the semiconductor 10 to give a solid bonding thereto. While on the other hand, the resulting the Sn-alloy layer 31 shows good compatibility to the diffusion barrier layer 20 of Mo, W, Nb, and Ni so that it is bonded to the diffusion barrier layer 20 at a sufficient adhesive strength. Particularly, when the diffusion barrier layer 20 of Mo, W, Nb, and Ni having high melting temperature is formed on the tin layer 31 by sputtering or other vapor deposition in an attendant high temperature environment, Sn in the Sn-alloy layer 31 is partly molten to make an alloy at the interface therebetween responsible for increased adhesive strength. With this result, the diffusion barrier layer 20 can be bonded to the thermoelectric semiconductor 10 at a sufficiently high adhesive strength. When forming the Sn-alloy layer 31 from the tin layer 30 deposited on the semiconductor 10, it may be possible to leave a tin lamina 32 in the upper surface of the resulting Sn-alloy layer 31. The tin lamina 32 is defined to include more than 90% of Sn based upon an atomic weight ratio, while the Sn-alloy layer 31 includes 10% or more of Sn based upon the atomic weight ratio. The tin lamina 32 may give a good platform to which the diffusion barrier layer 20 is bonded successfully at the sufficient adhesive strength. In addition, the tin lamina 32 exhibits ductility superior to the semiconductor 10 and the Sn-alloy layer 31 so that it can be responsible for absorbing a stress applied to the interface between the semiconductor and diffusion barrier layer 20, thereby contributing to the enhanced adhesive strength.

For the P-type thermoelectric semiconductor 10 of Bi—Sb—Te, the Sn-alloy layer 31 includes at least one of Sn—Bi alloy, Sn—Te alloy, Sn—Sb alloy, Sn—Bi—Te alloy, Sn—Bi—Sb alloy, and Sn—Te—Sb alloy. While on the other hand, for the N-type thermoelectric semiconductor 10 of Bi—Te—Se, the Sn-alloy layer 31 includes at least one of Sn—Bi alloy, Sn—Te alloy, Sn—Se alloy, Sn—Bi—Te alloy, Sn—Bi—Se alloy, and Sn—Te—Se alloy. These Sn-alloys are present in the form of either a solid solution, an intermetallic or combination of these.

Due to the interdiffusion between the tin layer 30 and the semiconductor 10, Sn will diffuse into the upper surface of the semiconductor 10 and get into lattice defects or minute cracks which had been made in the upper surface when processing the semiconductor 10 into a desired shape and which would lower the mechanical strength, thereby remedying the lowered mechanical strength of the surface region of the semiconductor for improving the surface strength of the semiconductor, in addition to the increased adhesive strength.

Figure 2:
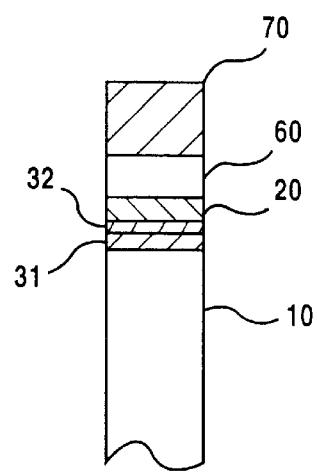
FIG. 2 is an enlarged view of a portion X of FIG. 1.
Figure 3:
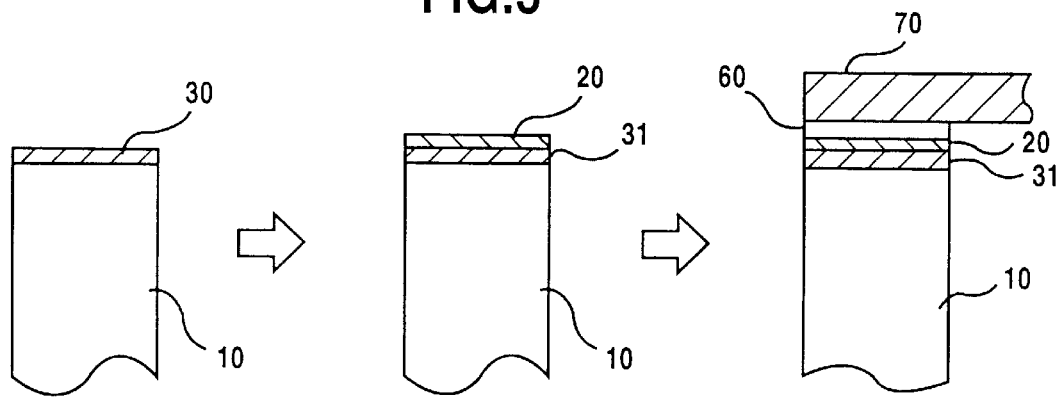
FIG. 3 is a schematic view illustrating a process of making the thermoelectric piece and connecting the same to an associate electrode.

FIG. 3 shows a process of making the thermoelectric piece. Firstly, the tin layer 30 is deposited on the opposed faces of the thermoelectric semiconductor 10 by a DC (direct current) sputtering or RF (radio frequency) sputtering within a vacuum chamber to have a thickness of 0.1 to 2.0 µm. The sputtering is made for 20 seconds to 40 minutes at a plasma generating power of 400–3000 W using a discharge gas of Ar or the like inert gas within the vacuum chamber maintained at 0.2 to 1.0 Pa. Thereafter, the tin layer 30 may be heated at 120 to 300° C. for 1 to 60 minutes to enhance the diffusion of Sn into the semiconductor and the elements of the semiconductor into the tin layer, developing the Sn-alloy layer 31 and the tin lamina 32 as an integral part of the Sn-alloy layer. Subsequently, the diffusion barrier layer 20 is deposited on thus formed Sn-alloy layer 31 or the tin lamina 32 by the like sputtering to have a thickness of 0.1 to 3.0 µm. Thus obtained thermoelectric pieces are connected to the associated electrodes 70 by use of the solder 60, as shown in FIGS. 1 and 2. The thermoelectric piece integrally formed with the diffusion barrier layers 20 may be bonded to the electrodes alternatively by wire bonding, or may be even directly plated with copper or the like electrically conductive material which defines itself electrode.

The above heating may be made after depositing the diffusion barrier layer 20 on the tin layer 30. In this case, the tin layer 30 can be heated as well to promote the formation of the Sn-alloy layer 31. It should be noted in this connection that the heating is intended to control an extent of the diffusion of Sn and the elements of the semiconductor, i.e., to give a proper thickness of the resulting Sn-alloy layer 31 responsible for the desired adhesive strength, and that the separate heating may be eliminated when the tin layer 30 is heated sufficiently at the time of being deposited by the sputtering. In this case, the tin layer 30 is caused to transform into the Sn-alloy layer of suitable thickness at the time of being sputtered on the semiconductor matrix.

Figure 4:
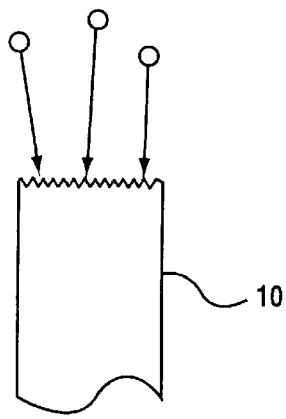
FIG. 4 is a schematic view illustrating a surface treatment of the thermoelectric piece prior to deposing a tin layer.

Prior to depositing the tin layer 30, it is preferred to teat the opposed faces of the thermoelectric semiconductor 10 through the steps of mechanically grinding the opposed faces in a wet environment; ultrasonically cleaning the polished faces; and making plasma etching the opposed faces. The mechanical grinding is made, for example, by using a sandpaper to give a roughened surface. The subsequent ultrasonic cleaning is made to remove residue on the grounded surfaces. As shown in FIG. 4, the plasma etching is made to give a finely roughened faces as well as to clean the faces for activating the faces for enhanced bonding to the subsequently deposited layer.

Figure 5:
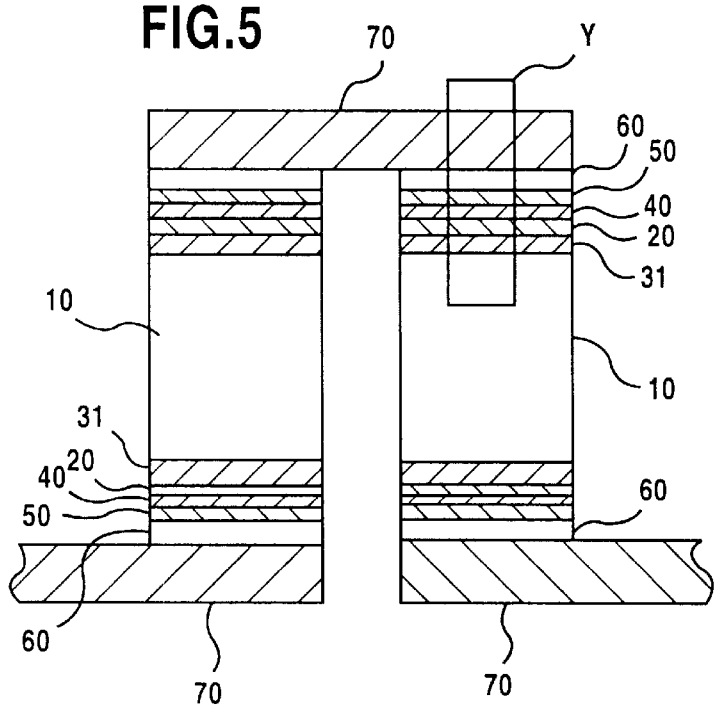
FIG. 5 is a partly sectional view of thermoelectric pieces connected to associated electrodes in accordance with another preferred embodiment of the present invention.
Figure 6:
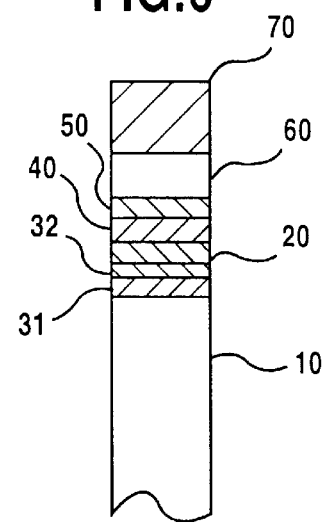
FIG. 6 is an enlarged view of a portion Y of FIG. 5.

FIGS. 5 and 6 show another embodiment of the present invention in which an additional diffusion barrier layer 40 of Ni is deposited on the diffusion barrier layer 20 and a terminal layer 50 is deposited on the Ni layer 40. In this embodiment, the diffusion barrier layer 20 is made of Mo, W, or Nb and deposited on the Sn-alloy layer 31 formed in the same manner as in the above embodiment. The additional diffusion protective Ni layer 40 is introduced to further block the diffusion of the soldering material 60 towards the thermoelectric semiconductor 10 and is deposited by sputtering within a vacuum chamber to have a thickness of 0.1 to 2.0 µm. The terminal layer 50 is made of Cu, Au, Bi—Sn, and Sn exhibiting good wettability to the soldering material 40 and is deposited by like sputtering in a vacuum chamber to have a thickness of 0.1 to 1.5 µm.

The following examples further illustrate the nature and advantages of the present invention.

Example 1

Thermoelectric semiconductors 10 of P-type and N-type were prepared to opposed faces. Each semiconductor is dimensioned to have a thickness of 2.0 mm and the opposed faces of 2.0 mm$^2$. The opposed faces of each semiconductor were ground by use of a sandpaper #400 and water to give a Ra (roughness average) of about 2000 Å. Then, the semiconductor was immersed in an ethanol bath to be ultrasonically cleaned therein. A plasma etching was then applied to the opposed faces for 60 seconds by a plasma developed at a radio frequency power of 300 W within a vacuum chamber supplied with an argon gas of 6.6 Pa. After this pre-deposition treatment, thus cleaned semiconductor with finely roughed opposed faces was placed in the vacuum chamber filled with an argon gas of 0.4 Pa for deposition of a tin layer 30 of 1.0 µm thickness by sputtering with a DC plasma of 1500 W for 45 seconds. Then, Mo layer was deposited by sputtering as the diffusion barrier layer 20 on the tin lamina 32. The sputtering was made for 30 seconds within the vacuum chamber at an argon gas pressure of 1.0 Pa and a DC plasma of 3000 W to give a thickness of 0.5 µm.

Example 2

Tin layer 30 of 0.5 µm thickness was deposited on each of the P-type and N-type semiconductors by sputtering with a DC plasma of 1500 W for 20 seconds at an argon gas pressure of 0.4 Pa. The other conditions are identical to those made in Example 1.

Example 3

Each of P-type and N-type semiconductors deposited with 1.0 µm thick tin layer 30 in the same manner and condictions as in Example 1 was heated at a temperature of 200° C. for 2 minutes within the vacuum chamber to diffuse the Sn and the elements of the semiconductor, particularly Te and Sb to provide a Sn-alloy layer 31 with a tin lamina 32 in the upper surface thereof. Then, Mo layer was deposited by sputtering as the diffusion barrier layer 20 on the tin lamina 32. The sputtering was made for 30 seconds within the vacuum chamber at an argon pressure of 1.0 Pa and a DC plasma of 3000 W to give a thickness of 0.5 µm.

Example 4

Each of P-type and N-type semiconductors, after being deposited with the tin layer 30 and with the Mo layer 20 on the tin layer 30 in the same manner and conditions as in Example 1, was heated at 200° C. for 2 minutes to enhance developing the Sn-alloy layer 31 with tin lamina 32 from the tin layer 30.

Example 5

Each of P-type and N-type semiconductors, after being deposited with the tin layer 30 and with the Mo layer 20 in the same manner and conditions as in Example 2, was further deposited with a Ni layer of 0.6 µm as an additional diffusion barrier layer 40 by sputtering with a DC plasma of 3000 W at 0.2 Pa of argon gas in the vacuum chamber for 30 seconds. Then, another sputtering was made to deposit a Cu layer 50 of 1.0 µm as the terminal layer 50 by using a DC plasma of 3000 W at 4.0 Pa of argon gas within the vacuum chamber for 38 seconds. The vacuum chamber was commonly utilized for the plasma etching, sputtering of tin layer, Mo layer, Ni layer and Cu layer.

Comparative Example 1

Each of P-type and N-type semiconductors, after being processed with the same pre-deposition treatment as in Example 1, was deposited with a 0.3 µm thick Ni layer as diffusion barrier layer by sputtering with a DC plasma of 3000 W for 10 seconds.

Comparative Example 2

Each of P-type and N-type semiconductors, after being processed with the same pre-deposition treatment as in Example 1, was deposited with a 0.3 μm thick Mo layer as diffusion barrier layer by sputtering with a DC plasma of 3000 W for 10 seconds.

Evaluation of Examples

Specimens obtained in Examples 1 to 5 and comparative Examples 1 and 2 were subjected to a tape peel test in accordance with JIS (Japanese Industrial Standard) K 5400, and specimens of Examples 1 to 5 are subjected to a pull-stud tensile test. In the tape peel test, an adhesive tape was adhered to the outer layer of the specimen and was peeled off to see whether the diffusion barrier layer was removed off the semiconductor. In the pull-stud test, a stud is utilized to adhere on the outermost layer of the specimen at a sufficient adhesive strength greater than the strength of the semiconductor itself and the stud was pulled in a direction perpendicular to the plane of the deposited layers to determine a adhesive strength at which the diffusion protective Mo layer was removed off the semiconductor, i.e., at which the interface between the diffusion protective Mo layer and the semiconductor was broken. Through the tape-peel test, it was found that none of the specimens of Examples 1 to 5 show any breakage between the diffusion protective Mo layer and the semiconductor, while the diffusion protective Ni layer as well as Mo layer of comparative Examples 1 and 2 were easily peeled off. Further, it was found, as shown in table 1 (tensile strength of the semiconductor itself is listed for reference purpose), that the P-type specimens of Example 1 to 5 exhibit the adhesive strength of at least 1.00 kgf/mm$^2$ and the N-type specimens of Examples 1 to 5 exhibit the adhesive strength of at least 2.01 kgf/mm$^2$, which is sufficient enough for the use of the thermoelectric piece. The adhesive strengths obtained in Examples 1 to 5 are far greater than those (0.5 to 0.8 kgf/mm$^2$) disclosed in the publication, "The Metallization of the Thermoelement Branches by Ionic Sputtering of the Nickel and Cobalt", 1995 ICT Proceedings, page 166 by G. D. Kunznetsov, et al, which reports that a adhesive strength of 0.5 to 0.8 kgf/mm$^2$ is obtained for a Ni layer or Cobalt layer deposited on the thermoelectric element.

TABLE 1

| | | deposited layer | pull-stud tensile strength (kgf/mm$^2$) |
|---|---|---|---|
| Example 1 | P | Sn(1.0 μm)-Mo(0.5 μm) | 2.16 |
| | N | | 2.95 |
| Example 2 | P | Sn(0.5 μm)-Mo(0.5 μm) | 1.95 |
| | N | | 2.90 |
| Example 3 | P | Sn(1.0 μm)-heating(200° C.:2 min.)-Mo(0.5 μm) | 2.34 |
| | N | | 2.01 |
| Example 4 | P | Sn(1.0 μm)-Mo(0.5 μm)- | 1.00 |
| | N | heating(200° C.:2 min.) | 2.44 |
| Example 5 | P | Sn(1.0 μm)-heating(200° C.:2 min.)- | 1.95 |
| | N | Mo(0.5 μm)-Ni(0.6 μm)-Cu(1.0 μm) | 2.90 |
| Comparative Example 1 | P | Ni (0.3 μm) | ** |
| | N | | ** |
| Comparative Example 2 | P | Mo (0.3 μm) | ** |
| | N | | ** |
| semi-conductor matrix | P | None | 3.49 |
| | N | | 4.05 |

**not available since diffusion protective Ni layer was easily peeled off

Further, an analysis was made to a mechanism of enhancing the adhesive strength of the interface between the Mo layer 20 and the semiconductor matrix 10. Through microscopic observation of the layered structure of Examples 1 to 5, it was found that the tin layer initially deposited on the semiconductor transforms into the Sn-alloy layer at the interface with the semiconductor due to interdiffusion, which is assumed to be responsible for the enhanced adhesive strength. FIGS. 7A to 7D illustrate respectively a layered structure, distribution of Sn, distribution of Te, and distribution of Sb for the P-type specimen, while FIGS. 8A to 8D respectively illustrate a layered structure, distribution of Sn, distribution of Te, and distribution of Bi for the N-type specimen. As shown in these figures, it is confirmed that the Sn-alloy layer chiefly includes Sn—Te and Sn—Sb by a combination of Sn from the tin layer and Te and Sb diffused from the semiconductor matrix. Element Sn is assumed to diffuse into lattice defects or minute cracks present in the roughened surface of the semiconductor to form an interstitial solid solution in the Sn-alloy layer. The above diffusion is assumed to occur at the time of sputtering the tin layer 30. Nevertheless, it may be found effective to additionally heat the tin layer after depositing the tin layer or even after the Mo layer 20 to enhance the interdiffusion of Sn and the elements of the semiconductor to a desired extent of strengthen the bonding at the interface between the tin layer 30 and the semiconductor 10, i.e., to form the Sn-alloy layer 31 of suitable thickness. Also, the tin layer forms a Sn—Mo alloy at the interface with the subsequently deposited Mo layer to give a strong bonding therebetween which was greater than that with the semiconductor matrix. In this sense, the tin layer is assumed to be transformed into the Sn-alloy layer 31 at the interface with the semiconductor matrix, and into Sn—Mo alloy layer at the interface with the Mo layer, while leaving the tin lamina 32 intermediate the Sn-alloy layer 31 and the Sn—Mo alloy layer. In determining suitable thickness of the Sn-alloy layer 31 and also that of the tin lamina 32, the Sn-alloy layer is defined to have 10% or more of Sn based upon an atomic weight ratio, the tin lamina 32 is defined to have more than 90% of Sn, and the thermoelectric semiconductor is considered to have less than 10% of Sn in its upper surface region. According to this definition, the Sn-alloy layer 31 is found to have a thickness of 0.1 to 3.0 μm. The preferred range of the thickness of the Sn-alloy layer is obtained due to the observed fact that the Sn-alloy layer includes a portion of 0.1 μm thick which could enhance the adhesive strength between the Mo layer and the semiconductor matrix and that the Sn-alloy layer 31 will not increase its thickness exceeding about 3.0 μm when formed from about 1.0 μm thick tin layer, which means that the Sn-alloy layer will not propagate even subjected to a number of heat cycle during an extended use of the thermoelectric piece and therefore demonstrates that the thermoelectric characteristic will be kept constant over the extended use.

Further, it was confirmed that the specimens of Example 1 will not lower the desired thermoelectric characteristic by the presence of the Mo layer when subjected to an elevated temperature which would be otherwise assumed to promote diffusion of the soldering material into the semiconductor. To this end, each of the specimens were bonded by a soldering material of 60% Sn-40% Pb to copper-made electrodes. The P-type specimen was heated to 150° C. for 2 hours, and the N-type specimen was heated at 200° C. for 16 hours. Thermoelectric characteristic was measured for each specimen before and after the heating, respectively. As shown in table 2 below, no substantial change is seen in the thermoelectric characteristic both for P-type and N-type specimen.

TABLE 2

| | heating condition | Thermoelectric characteristic (Z × 10³) | |
|---|---|---|---|
| | | Before heating | After heating |
| P-type | 150° C., 2 hours | 2.86 | 2.88 |
| N-type | 200° C., 16 hours | 2.62 | 2.59 |

The thermoelectric characteristic is known as thermoelectric figure of merit Z which is defined as $$Z = \frac{\alpha^2 \sigma}{k}$$

wherein α is a Seebeck coefficient (volt/kelvin), σ is electrical conductivity (S/m), and k is thermal conductivity (W/m-K).

Figure 9:
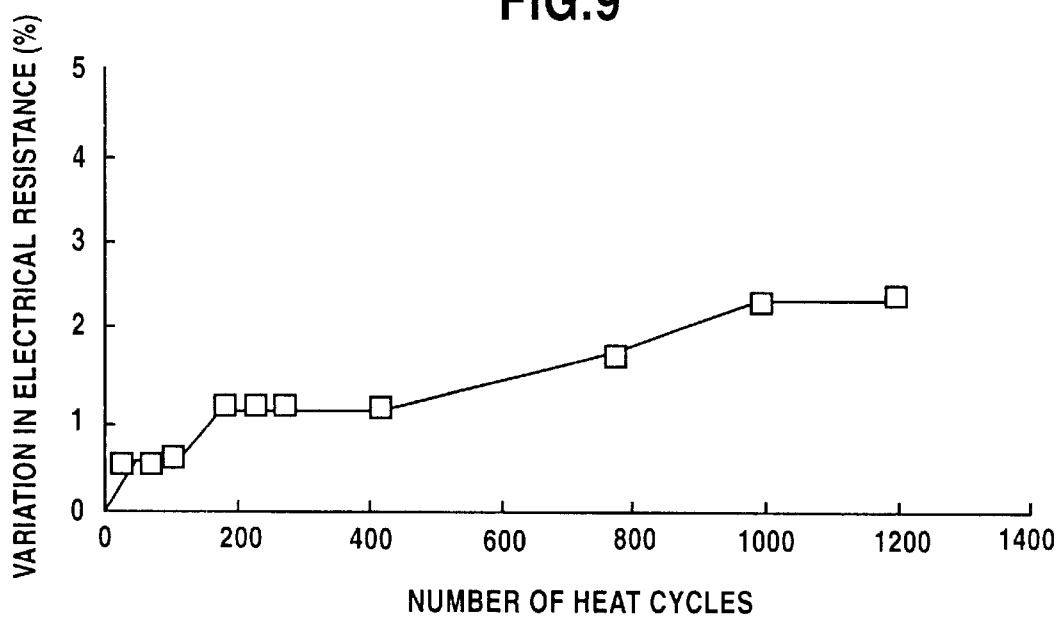
FIG. 9 is a graph illustrating a relation between the number of heat cycles and electrical resistance variation of a thermoelectric heater/cooler composed of the thermoelectric pieces.
Figure 7A:
FIG. 7A is a digitally processed image of a SEM photograph illustrating a cross section of layered structure of the P-type thermoelectric piece of the embodiment of FIG. 1.
Figure 7A:
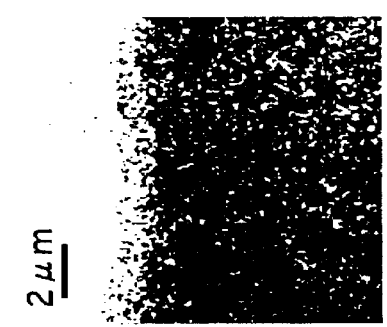
Figure 7A:
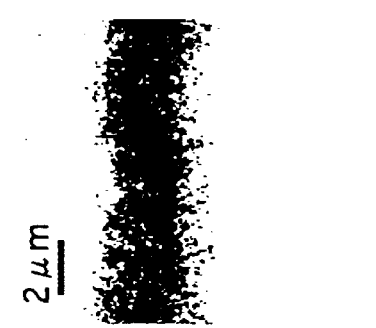
Figure 7A:
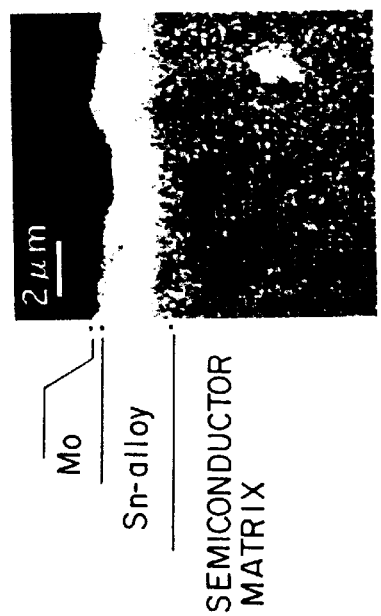
Figure 8A:
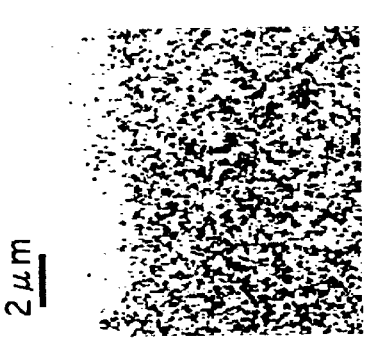
FIG. 8A is a digitally processed image of a SEM photograph illustrating a cross section of layered structure of the N-type thermoelectric piece of the N-type thermoelectric pieces of the embodiment of FIG. 1.
Figure 8A:
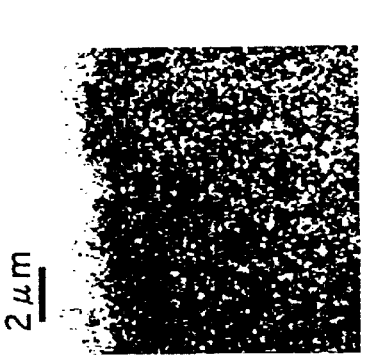
Figure 8A:
Figure 8A:
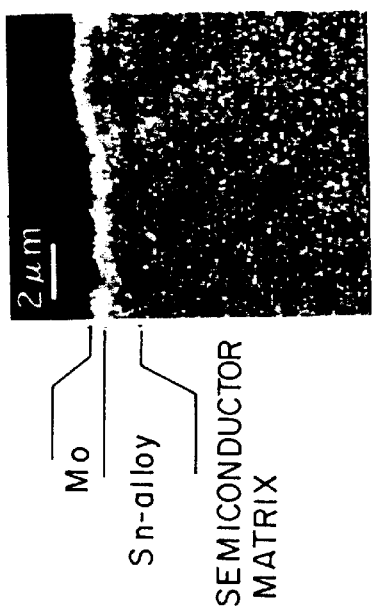

Further, the specimens of Examples were assembled into a thermoelectric device in which the semiconductors of P-type and N-type were held between a pair of substrates and connected to electrodes on the substrate to form a series circuit so as to effect heating and cooling respectively on the sides of the substrates by a current fed through the series circuit of the semiconductors. The resulting thermoelectric device was then subjected to a heat-cycle test in which a heat cycle was repeated a number of times to vary the temperature of the one substrate from 30 to 80° C. by feeding a current of 5A to the circuit while keeping the temperature of the other substrate at 25 to 30° C. with the both substrates being secured at 150 kgf. As shown in FIG. 9, even after repeating the heat cycle of 1000, the thermoelectric device exhibited as less as 3% variation in electrical resistance, which demonstrates that the thermoelectric device can operate successfully.

We claim:

1. A thermoelectric piece comprising:
   a thermoelectric semiconductor of Bi—Sb—Te or Bi—Te—Se, said thermoelectric semiconductor alloy having opposed faces;
   a Sn-alloy layer disposed on each of said opposed faces of said semiconductor, said Sn-alloy layer comprising Sn as an essential metal element which diffuses mutually with at least one element of said semiconductor to form at least one Sn-alloy selected from a group consisting of Sn—Bi alloy, Sn—Te alloy, Sn—Sb alloy, Sn—Se alloy, Sn—Bi—Te alloy, Sn—Bi—Sb alloy, Sn—Bi—Se alloy, Sn—Te—Se alloy, and Sn—Te—Sb alloy, said Sn-alloy being present in the form of one of a solid solution, an intermetallic compound, and a combination thereof;
   a diffusion barrier layer disposed on each said Sn-alloy layer, said diffusion barrier layer being made of at least one element selected from the group consisting of Mo, W, Nb and Ni for preventing diffusion of the elements of said thermoelectric semiconductor and a soldering material utilized for electrical connection of said thermoelectric semiconductor to an eternal electric circuit.

2. A thermoelectric piece comprising:
   a thermoelectric semiconductor of Bi—Sb—Te or Bi—Te—Se, said thermoelectric semiconductor alloy having opposed faces;
   a Sn-alloy layer disposed on each of said opposed faces of said semiconductor, said Sn-alloy layer comprising Sn as an essential metal element which diffuses mutually with at least one element of said semiconductor to form at least one Sn-alloy selected from a group consisting of Sn—Bi alloy, Sn—Te alloy, Sn—Sb alloy, Sn—Se alloy, Sn—Bi—Te alloy, Sn—Bi—Sb alloy, Sn—Bi—Se alloy, Sn—Te—Se alloy, and Sn—Te—Sb alloy, said Sn-alloy being present in the form of one of a solid solution, an intermetallic compound, and a combination thereof, wherein said Sn-alloy layer is defined to have 10% or more of Sn based upon an atomic weight ratio, said Sn-alloy layer having a thickness of 0.1 to 3.0 μm; and
   a diffusion barrier layer having a thickness of 0.1 to 5.0 μm disposed on each said Sn-alloy layer, said diffusion barrier layer being made of at least one element selected from the group consisting of Mo, W, Nb and Ni for preventing diffusion of the elements of said thermoelectric semiconductor and a soldering material utilized for electrical connection of said thermoelectric semiconductor to an external electric circuit.

3. The thermoelectric piece as set forth in claim 2, wherein said Sn-alloy layer being formed therein with a tin lamina having more than 90% of Sn based upon the atomic weight ratio, said tin lamina having a thickness of less than 2.0 μm.

4. A process of making a thermoelectric piece comprising the following steps of:
   a) preparing a thermoelectric semiconductor of Bi—Sb—Te or Bi—Te—Se having opposed faces;
   b) depositing a layer of Sn on each of said opposed faces of said thermoelectric semiconductor;
   c) diffusing said Sn mutually with at least one element of said thermoelectric semiconductor to form an Sn-alloy layer on the each of the opposed faces of said thermoelectric semiconductor;
   d) depositing a diffusion barrier layer on each of said Sn-alloy layer, said diffusion barrier layer being made of at least one element selected from the group consisting of Mo, W, Nb, and Ni for preventing diffusion therethrough of the elements of said thermoelectric semiconductor as well as a soldering material utilized for electrical connection of said thermoelectric semiconductor to an external electric circuit, wherein the layer of Sn and said diffusion barrier layer are formed respectively by a sputtering or vapor deposition.

5. The process as set forth in claim 4, wherein said diffusion barrier layer is made of at least one element selected from the group consisting of Mo, W, and Nb, and wherein said process further including the steps of:
   depositing an additional diffusion barrier layer of Ni on each of said diffusion barrier layer of Mo, W, or Nb for further preventing diffusion therethrough of the elements of said thermoelectric semiconductor and the soldering material; and
   depositing a terminal layer on each of said additional diffusion barrier layer of Ni, said terminal layer being made of an element selected from the group consisting of Cu, Au, Bi—Sn, and Sn for soldering connection with an electrode.

6. The process as set forth in claim 5, wherein said additional diffusion barrier layer is formed by a sputtering or vapor deposition.

7. The process as set forth in claim 6, further including a step of: heating the tin layer of Sn at 120° C. to 300° C. for 1 minute to 60 minutes after depositing said tin layer.

8. A process of making a thermoelectric piece comprising the following steps of:
   a) preparing a thermoelectric semiconductor of Bi—Sb—Te or Bi—Te—Se having opposed faces;

b) depositing a layer of Sn on each of said opposed faces of said thermoelectric semiconductor;

c) diffusing said Sn mutually with at least one element of said thermoelectric semiconductor to form an Sn-alloy layer on the each of the opposed faces of said thermoelectric semiconductor;

d) depositing a diffusion barrier layer on each of said Sn-alloy layer, said diffusion barrier layer being made of at least one element selected from the group consisting of Mo, W, Nb, and Ni for preventing diffusion therethrough of the elements of said thermoelectric semiconductor as well as a soldering material utilized for electrical connection of said thermoelectric semiconductor to an external electric circuit, further including a pre-deposition treatment of cleaning said opposed faces of said thermoelectric semiconductor before depositing said tin layer, said pre-deposition treatment comprises steps of:

mechanically grinding said opposed faces in a wet environment;

ultrasonically cleaning said opposed faces; and making plasma etching said opposed faces.

9. The process as set forth in any one of claims 5 to 7, wherein said tin layer, said Sn-alloy layer, said diffusion barrier layer, said additional diffusion barrier layer, and said terminal layer are formed continuously in a vacuum environment.

* * * * *